United States Patent
Wu et al.

(10) Patent No.: US 6,931,089 B2
(45) Date of Patent: Aug. 16, 2005

(54) PHASE-LOCKED LOOP WITH ANALOG PHASE ROTATOR

(75) Inventors: Bin Wu, San Jose, CA (US); Dong Zheng, San Jose, CA (US)

(73) Assignee: Intersil Corporation, Milpitas, CA (US)

( * ) Notice: Subject to any disclaimer, the term of this patent is extended or adjusted under 35 U.S.C. 154(b) by 673 days.

(21) Appl. No.: 09/934,632

(22) Filed: Aug. 21, 2001

(65) Prior Publication Data

US 2003/0039329 A1 Feb. 27, 2003

(51) Int. Cl.[7] .............................................. H04L 27/10
(52) U.S. Cl. .................... 375/376; 327/248; 327/361; 375/240; 375/270; 375/274; 375/272; 375/334
(58) Field of Search .................... 375/376; 327/248, 327/361

(56) References Cited

U.S. PATENT DOCUMENTS

| | | | |
|---|---|---|---|
| 4,035,725 A | 7/1977 | Guidoux | 325/42 |
| 4,158,174 A | 6/1979 | Gruenberger et al. | 325/404 |
| 4,389,727 A | 6/1983 | Rouffet | 375/110 |
| 4,937,873 A | 6/1990 | McAulay et al. | 381/51 |
| 5,193,224 A * | 3/1993 | McNicol et al. | 455/126 |
| 5,233,631 A | 8/1993 | Labat et al. | 375/81 |
| 5,237,587 A | 8/1993 | Schoolcraft | 375/1 |
| 5,301,210 A | 4/1994 | Vandamme et al. | 375/83 |
| 5,517,526 A | 5/1996 | Caudron et al. | 375/232 |
| 5,584,065 A * | 12/1996 | Monzello | 455/296 |
| 5,612,975 A * | 3/1997 | Becker et al. | 375/319 |
| 5,793,818 A | 8/1998 | Claydon et al. | 375/326 |
| 5,812,927 A | 9/1998 | Ben-Efraim et al. | 455/3.2 |
| 6,002,279 A | 12/1999 | Evans et al. | 327/144 |
| 6,111,543 A | 8/2000 | Le Herisse | 342/413 |
| 6,166,971 A | 12/2000 | Tamura et al. | 365/198 |
| 6,242,965 B1 | 6/2001 | Pickering et al. | 327/359 |
| 6,509,773 B2 * | 1/2003 | Buchwald et al. | 327/248 |

* cited by examiner

*Primary Examiner*—Stephen Chin
*Assistant Examiner*—Erin M. File
(74) *Attorney, Agent, or Firm*—Edward C. Kwok; MacPherson Kwok Chen & Heid LLP

(57) ABSTRACT

A phase-locked loop includes a phase detector which receives an input signal and a first internal periodic signal and provides a phase signal indicative of a phase difference between the input signal and the internal signal. A rotator then receives the phase signal and provides first and second periodic signals each having a frequency that is a function of the phase difference, the first and second periodic signals being 90 degrees out of phase with each other. An interpolator circuit then linearly combines the first and second periodic signals with third and fourth periodic signals to provide the first internal periodic signal. The interpolator circuit may provide a second internal periodic signal that is 90 degrees out of phase relative to the first internal periodic signal. The phase-locked loop may further include a low-pass filter provided between the phase detector and the rotator.

24 Claims, 11 Drawing Sheets

US 6,931,089 B2

PHASE-LOCKED LOOP WITH ANALOG PHASE ROTATOR

BACKGROUND OF THE INVENTION

Field of the Invention

The present invention relates to high speed semiconductor integrated circuits. In particular, the present invention relates to integrated circuits including phase-locked loops used in high speed applications.

SUMMARY OF THE INVENTION

The present invention provides a phase-locked loop and its associated methods. In one embodiment, a phase detector receives an input signal and a first internal periodic signal and provides a phase signal indicative of a phase difference between the input signal and the internal signal. A rotator then receives the phase signal and provides a first and second periodic signals each having a period which is a function of the phase difference, the first and the second periodic signals being 90 degrees out of phase with each other. An interpolator circuit then linearly combines the first and second periodic signals with a third periodic signal and a fourth periodic signal to provide the first internal periodic signal.

In one embodiment, the interpolator circuit further provides a second internal periodic signal, the second internal periodic signal being 90 degrees out of phase relative to the first internal periodic signal. The phase-locked loop may further include a low-pass filter provided between the phase detector and the rotator.

In one embodiment, the rotator in the phase-locked loop provides that the first (Q) and second (I) periodic signals are given by the equations:

$$Q = A \cos(kf(p))$$

$$I = A \sin(kf(p))$$

where A is the amplitude of the Q and I signals, k is a gain of the rotator circuit, and f(p) representing a function of the phase difference. In one instance, the phase difference is represented in the phase signal as a voltage. The third and fourth periodic signals may each have a frequency that is substantially a frequency of the input signal. The rotator may further include an enforcer providing an error signal indicating a deviation in amplitude of the first and second periodic signals. This error signal is fed back to the rotator to maintain a substantially constant amplitude in the Q and I signals. In one instance, the error signal is a function of the value $\Delta = r^2 - I^2 - Q^2$, where r is a desired amplitude for the Q and I signals. In one implementation, the desired amplitude is approximately 0.4 volts.

In one embodiment, the phase-locked loop of the present invention is provided with third (x) and fourth (y) periodic signals given by the equations:

$$x = \sin \omega t,$$

$$y = \cos \omega t,$$

where $\omega$ represents a frequency of the third and fourth periodic signals.

In one embodiment, the first internal periodic signal S(t) is given by:

$$S(t) = \sin(\omega t - \phi),$$

where $\phi$ is indicative of said phase difference.

The present invention is better understood upon consideration of the detailed description below and the accompanying drawings.

BRIEF DESCRIPTION OF THE DRAWINGS

To facilitate comparisons among the figures and to avoid repetition, like elements in the figures are accorded like reference numerals.

DETAILED DESCRIPTION OF THE PREFERRED EMBODIMENTS

The present invention provides a phase-locked loop circuit and a method for providing such a phase-locked loop circuit.

Figure 1:
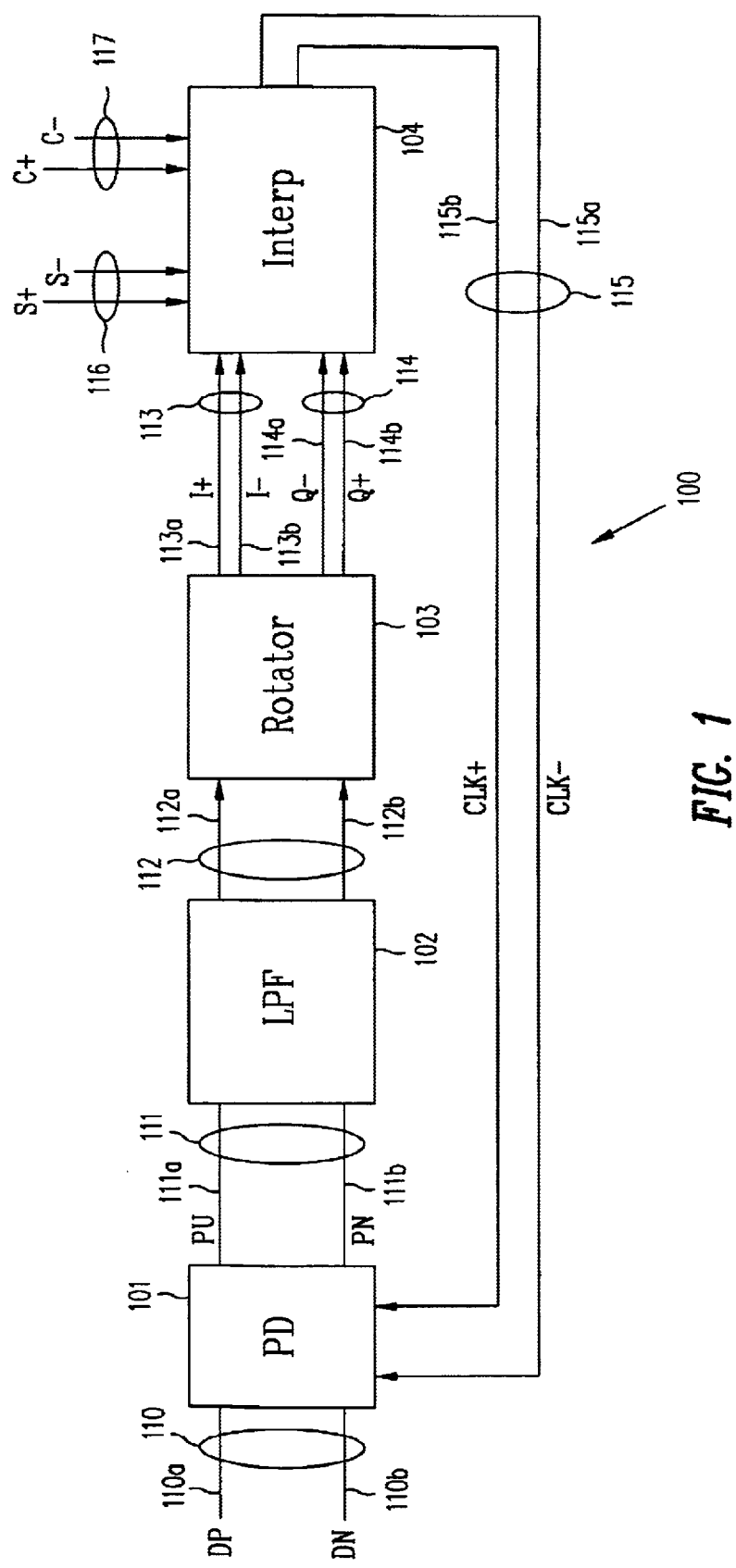
FIG. 1 is a block diagram of a phase-locked loop 100, in accordance with one embodiment of the present invention.

FIG. 1 is a block diagram of a phase-locked loop 100, in accordance with one embodiment of the present invention. As shown in FIG. 1, phase detector 101 receives differential data signal 110 and output differential signal 115 to provide phase signals 111. The voltage difference between phase signals 111 (i.e., voltage difference v(t) between the component signal "up" or 111a and "down" or 111b of phase signals 111) represents a measure of the phase difference between data signal 110 and output signal 115. Phase signals 111 are provided to low-pass filter 102. Low-pass filter 102 provides filtered differential signal 112 to rotator 103. In response, rotator 103 provides two differential phase signals 113 and 114, also referred to as differential phase signals I(t) and Q(t) below, according to equations (1) and (2):

$$Q = A \cos(k \int v(t) dt) = A \cos k\phi \quad (1)$$

$$I = A \sin(k \int v(t) dt) = A \sin k\phi \quad (2)$$

where A is the amplitude of the Q and I signals, k is a gain in rotator 103, and $\phi$ represents the phase difference between clock signal 110 and output signal 115, integrated over a specified time period.

Interpolator 104 receives differential phase signals 113 and 114 and differential quadrature signals 116 and 117 (respectively denoted by sin ω t and cos ω t, where ω is the clock frequency of data signal 110) to provide output differential quadrature signal 115 (denoted as C(t) below), according to equation (3):

$$C(t)=A\cos \omega t \cos k\phi + A \sin \omega t \sin k\phi = A \cos(107\, t - k\phi) \quad (3)$$

Quadrature signals 116 and 117 are internal clock signals derived from the output signals of an internal clock generator (not shown). Optionally, output differential quadrature signal 118 (denoted as S(t), not shown in FIG. 1), which is 90 degrees out of phase with signal C(t), can also be provided in accordance with equation (4):

$$S(t)=A\sin \omega t \cos k\phi - A \cos \omega t \sin k\phi = A \sin(\omega t - k\phi) \quad (4)$$

Output signal 115 and, optionally output signal 118, can then be provided to vary the phase of various internal clock signals, so as to maintain phase relationships with respect to input data signal 110. Output signal 115 can be provided to phase detector 101, as shown in FIG. 1. Phase-locked loop 100 tends to minimize the phase difference φ between input clock signal 110 and output signal 115.

Figure 2:
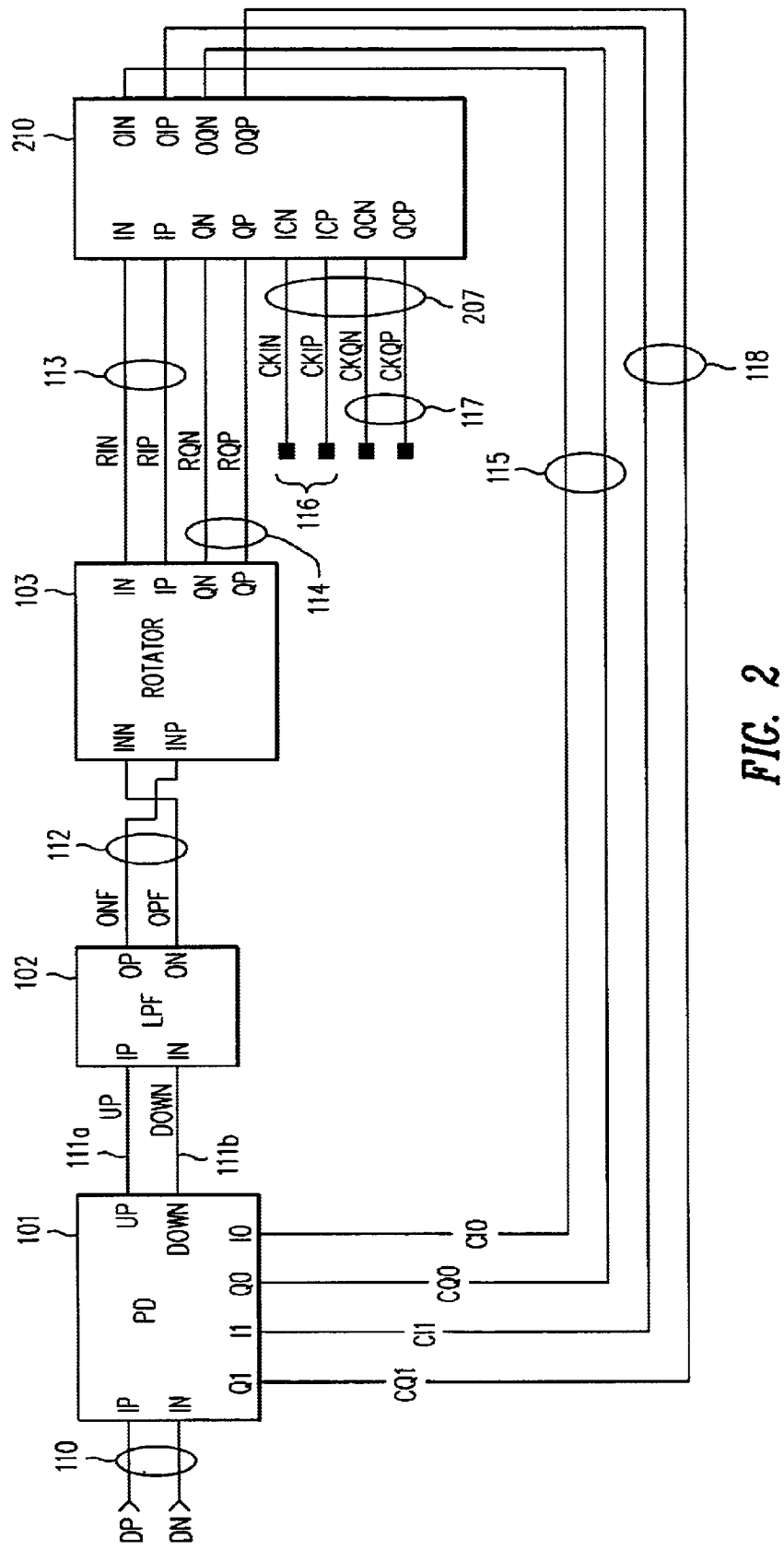
FIG. 2 shows one implementation of phase-locked loop 100 in phase-locked loop circuit 200.

One implementation of phase-locked loop 100 is shown in FIG. 2 as phase-locked loop circuit 200. In phase-locked loop circuit 200, a conventional clock generator (not shown) provides internal quadrature clock signals 116 and 117, collectively referred to as clock signals 207, at approximately 1.6 GHz. At the same time, phase detector 101 receives input data signal 110, and output signals 115 and 118, and provides "up" and "down" phase signals 111 (i.e., signals 111a and 111b). Phase detector 101 can be implemented, for example, by a conventional "bang-bang" detector (also known as an "Alexander's phase detector").

Figure 3:
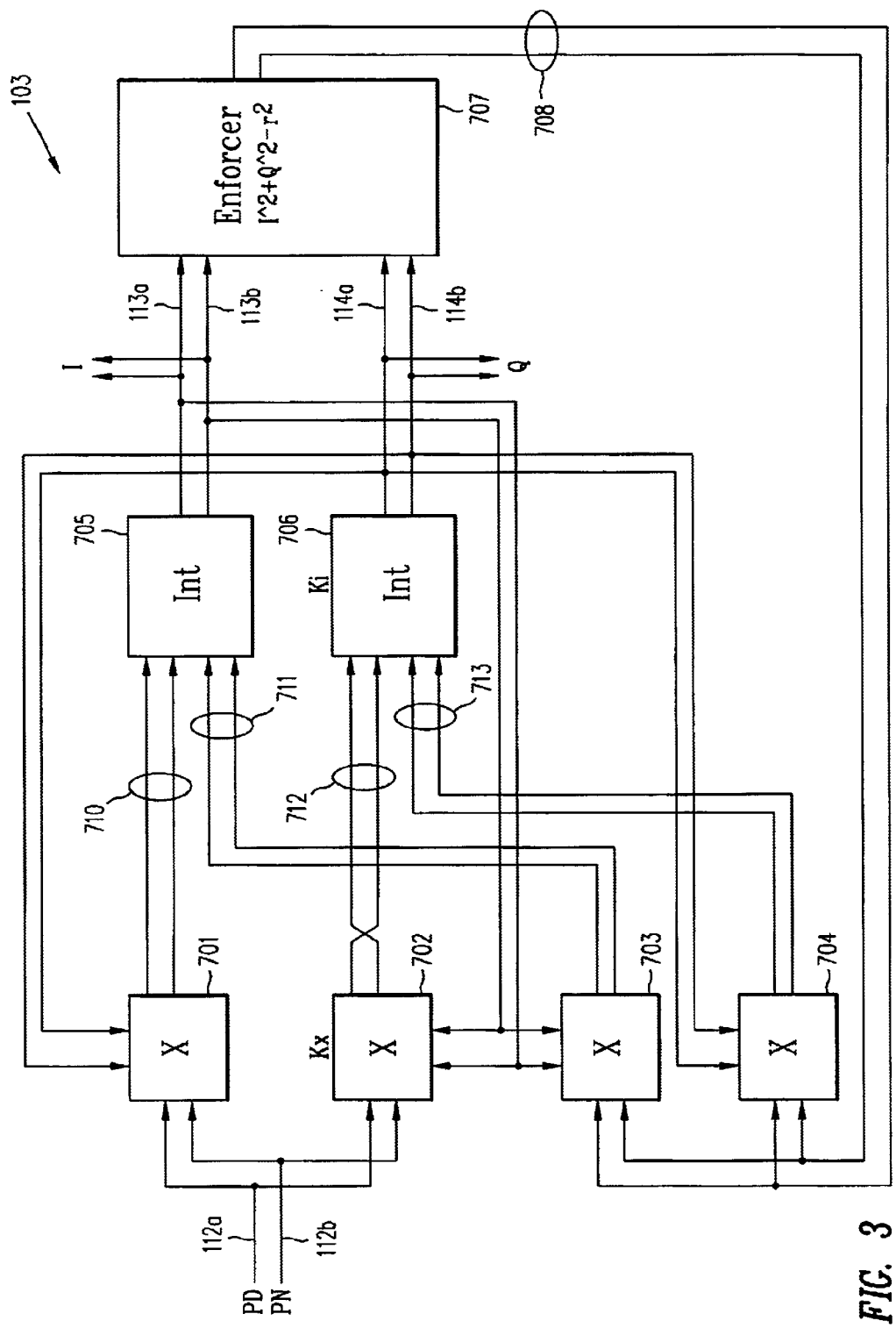
FIG. 3 is a block diagram showing rotator 103, according to one embodiment of the present invention.

In FIG. 2, phase signals 111a and 111b of phase detector 101 are provided to low-pass filter 102. Low-pass filter 102 can be implemented, for example, by a conventional low-pass filter circuit. FIG. 2 shows that integrated phase signals 112a and 112b are provided to rotator 103. FIG. 3 is a block diagram showing rotator 103, in accordance with one embodiment of the present invention. As shown in FIG. 3, rotator 103 includes multipliers 701–704, integrators 705–706 and enforcer 707. In rotator 103, multiplier 701 multiplies differential phase signal 112 (i.e., signal v(t)) with differential signal 114 (i.e., quadrature signal Q(t)) to provide differential signal 710, which is provided to integrator 705. Integrator 705 integrates the sum of differential signal 710 and differential output signal 711 to provide differential signal 113 (i.e., quadrature signal I(t)). Similarly, multiplier 702 multiplies the polarity-reversed differential phase signal 112 (i.e., signal −v(t)) with differential signal 113 (i.e., quadrature signal I(t)) to provide differential signal 712, which is provided to integrator 706. Integrator 706 integrates the sum of differential signal 712 and differential output signal 713 to provide differential signal 114 (i.e., quadrature signal Q(t)). Differential signals 711 and 713 are the product of output differential signals 708 ("Δ") and 113, and the product of differential signals 708 and 114, respectively. Differential signal 708 is defined by the following equation (5):

$$\Delta = r^2 - I^2 - Q^2 \quad (5)$$

where r is a desired amplitude for signals I and Q. Thus, the values of I(t) and Q(t) are governed by the following equations (6) and (7):

$$I(t) = \int (k_1 k_2 Q(t) v(t) + k_3 \Delta \cdot I(t)) dt \quad (6)$$

$$Q(t) = \int (-k_1 k_2 I(t) v(t) + k_3 \Delta \cdot Q(t)) dt \quad (7)$$

where $k_1$ and $k_2$ are the gains of each of multipliers 701–704 and each of integrators 705–706, and $k_3$ is the total path gain in enforcer 707. Since Δ is constant over the relevant time period of integration (i.e., over half a period of clock signal 116 or 117), the resulting quadrature signals 113 and 114 are given by equations (8) and (9):

$$I(t) = I_0 e^{K_3 \Delta \cdot t} \sin k \int v(t) dt \quad (8)$$

$$Q(t) = Q_0 e^{K_3 \Delta \cdot t} \cos k \int v(t) dt \quad (9)$$

where $I_0$ and $Q_0$ are initial values for the I(t) and Q(t) signals, and k is the product $k_1 k_2$ provided above. Because Δ is an error signal representing the transient amplitude deviation from the trigonometrical identity relating I(t) and Q(t), and since the solutions of I(t) and Q(t) as provided above in equations (8) and (9) enforces the trigonometrical identity, the value of Δ tends to zero, resulting in:

$$I(t) = R_0 \sin k \int v(t) dt \quad (8)$$

$$Q(t) = R_0 \cos k \int v(t) dt \quad (9)$$

where $R_0$ is the steady state amplitude of signals I(t) and Q(t).

Figure 4:
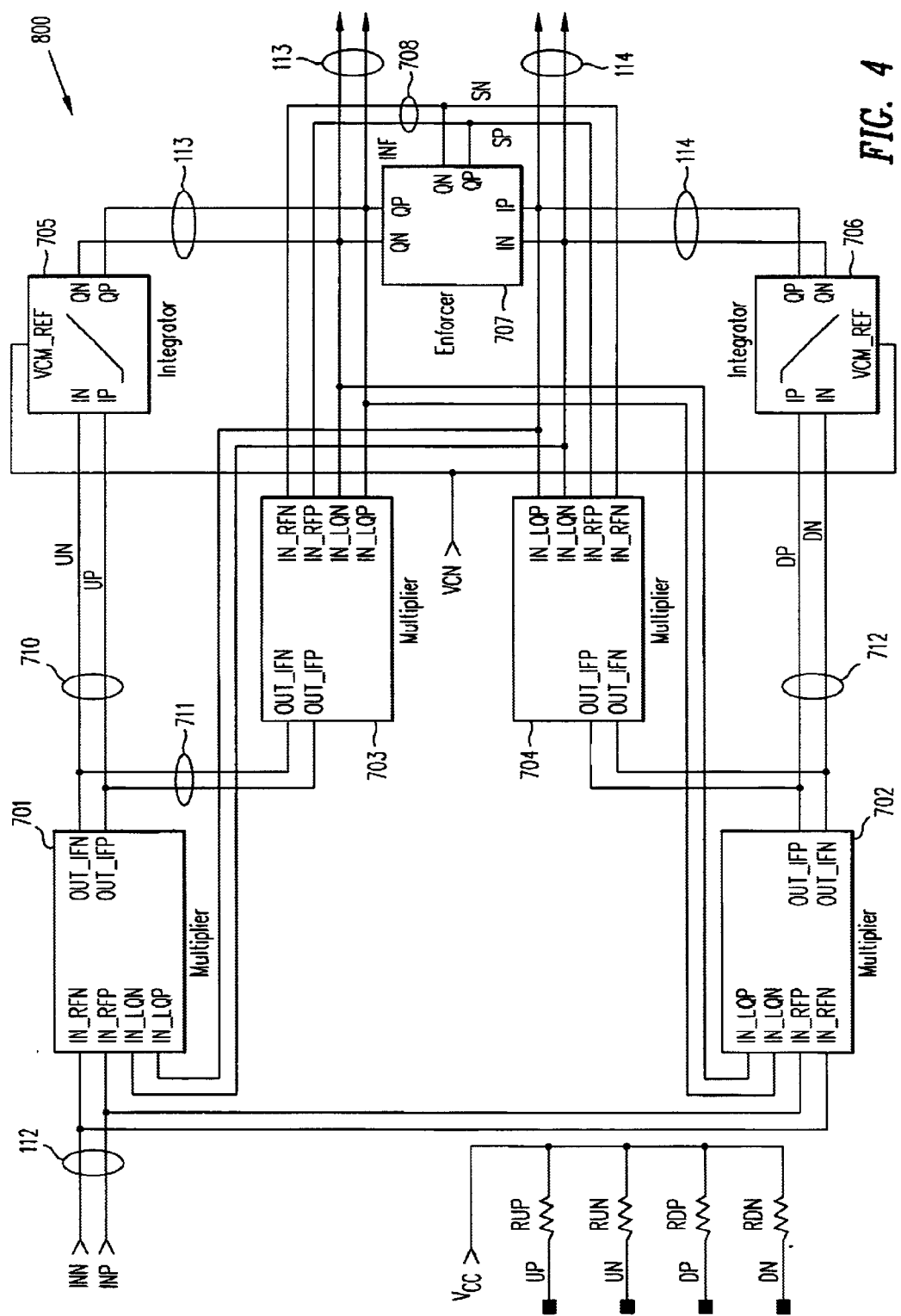
FIG. 4 shows rotator circuit 800, which can be used to implement rotator 103, in accordance with the embodiment of the present invention shown in FIG. 3.

FIG. 4 shows rotator circuit 800, which can be used to implement rotator 103, in accordance with the embodiment of the present invention shown in FIG. 3 above. The operation of rotator circuit 800 is substantially the same as that described above with respect to FIG. 3 above. A detailed description of the operation of rotator circuit 800 is therefore omitted. In rotator circuit 800, a voltage generator (not shown) provides a bias voltage $V_{CM-REF}$ to integrators 705 and 706. Such a voltage generator can be implemented by serially connected diodes between supply voltage $V_{CC}$ and the ground reference, with $V_{CMREF}$ provided from the output terminal of the diode connected to $V_{CC}$, thus providing $V_{CMREF}$ to be approximately ¾ $V_{CC}$, when four serially connected diodes are used.

Figure 5:
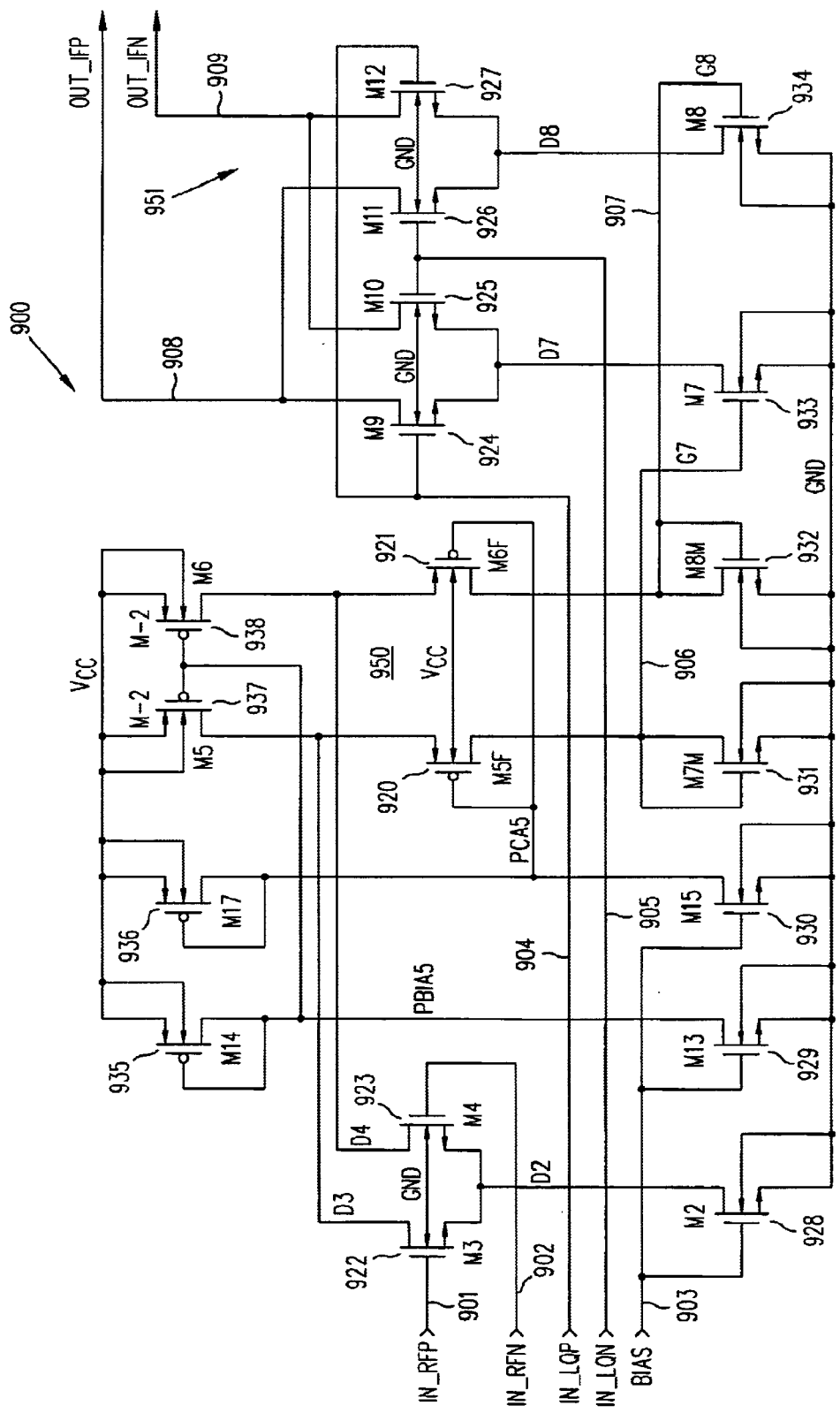
FIG. 5 shows differential multiplier circuit 900, which can be used to implement any of multipliers 701–704 of FIG. 4.

FIG. 5 shows differential multiplier circuit 900, which can be used to implement any of multipliers 701–704 of FIG. 4. As shown in FIG. 5, differential multiplier circuit 900 includes differential amplifier 950 and multiplier 951. Differential amplifier 950 provides an output differential signal on terminals 906 and 907 to multiplier 951. In differential amplifier 950, a bias voltage is provided at terminal 903 to set the current sources represented by NMOS transistors 928–930. Diode-connected PMOS transistors 936 and NMOS transistor 930 together provide a first bias voltage, which is applied to the gate terminals of cascode PMOS transistors 920 and 921. Similarly, diode-connected PMOS transistor 935 and NMOS transistor provides a second bias voltage, which is applied to PMOS transistors 937 and 938. Together, PMOS transistors 920–921 and 937–938 set a DC offset voltage for the output signals of differential amplifier 950 at terminals 906 and 907. The first input differential signal at terminals 901 and 902, i.e., the signals at the gate terminals of input transistors 922 and 923, respectively, are amplified to a proportional AC voltage superimposed on the DC offset voltage at output terminals 906 and 907.

The signals of output terminals 906 and 907 set the current sources in multiplier 951 represented by NMOS transistors 933 and 934. Since the second input signal at input terminals 904 and 905 are provided to the gate terminals of input transistors 924–927 of multiplier 951, the differential signal at terminals 908 and 909 represents the product of the first and second input differential signals. In this embodiment, both the input and output signals of differential multiplier circuit 900 are expected to have a DC offset voltage of 1.35 volts, and an AC component varying within 0.2 volts about the DC offset voltage.

Figure 6:
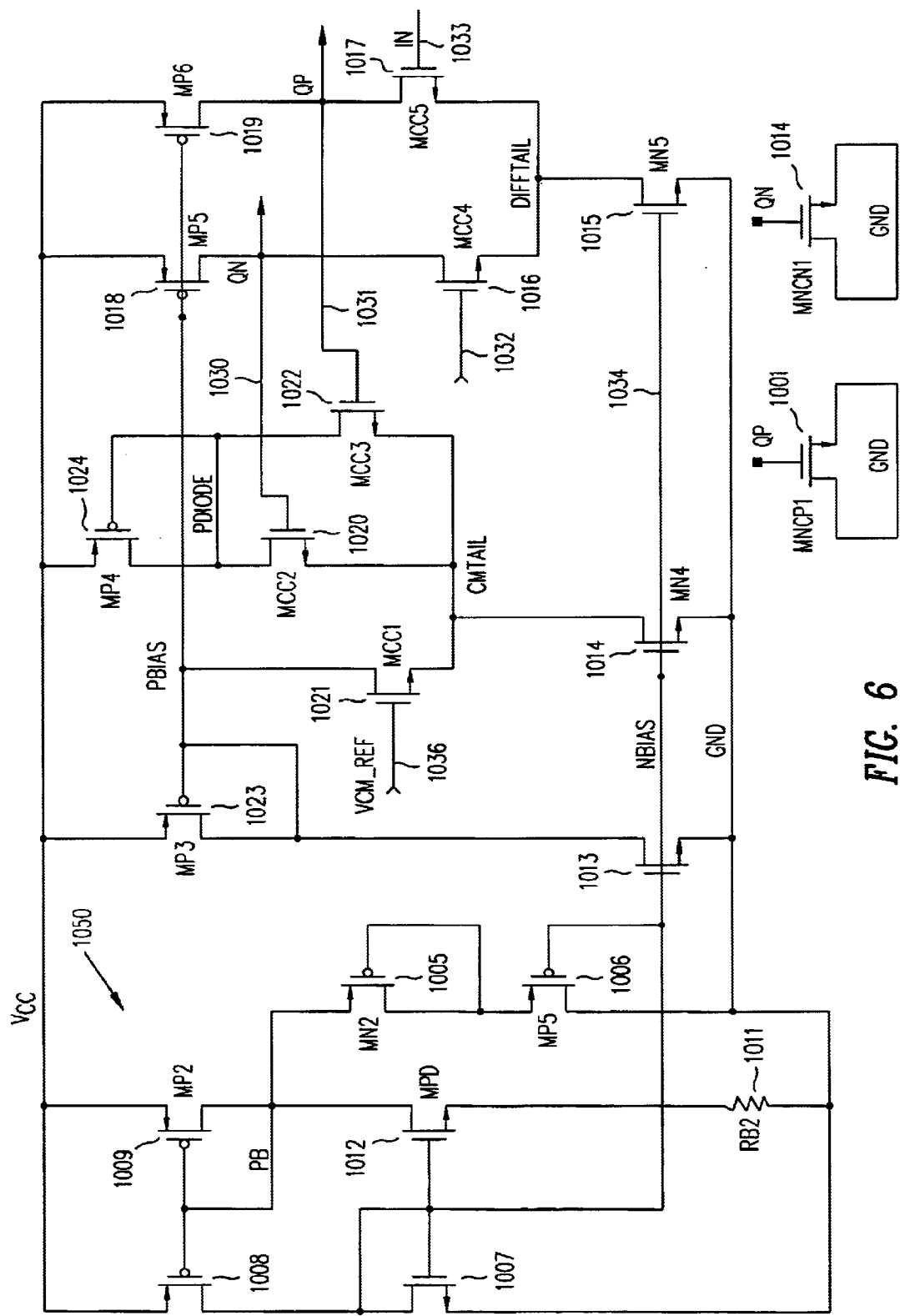
FIG. 6 shows integrator circuit 1000, which can be used to implement either one of integrators 705–706.

FIG. 6 shows integrator circuit 1000, which can be used to implement either one of integrators 705–706. As shown in FIG. 6, bias circuit generator 1050 provides a bias voltage at terminal 1034 that is applied to each of the current sources represented by transistors 1013–1035. The bias voltage is provided by the current in the current path including PMOS transistor 1009, NMOS transistor 1012, and resistors 1011. This bias voltage is approximately three diode-drops from supply voltage $V_{CC}$, being substantially the voltage drop across the source and drain terminals of PMOS transistors 1009 and 1005, and the gate-to-source voltage of PMOS transistor 1006. At the same time, PMOS transistor 1023 and NMOS transistor 1013 provides a second bias voltage for biasing PMOS transistors 1018 and 1019. The input differential signal across terminals 1032 and 1033, applied to the gate terminals of transistors 1016 and 1017, are amplified and provided as an output differential signal at output terminals 1030 and 1031. Output terminals 1030 and 1031 are connected to MOS capacitors 1001–1002 and 1003–1004, respectively. The output signals at terminals 1030 and 1031 have a DC offset voltage set by the $V_{CM\text{-}REF}$ bias voltage discussed above, as a result of the action of NMOS transistors 1020–1022, which receive the signals at terminal 1030, 1036 and 1031, respectively.

Figure 7:
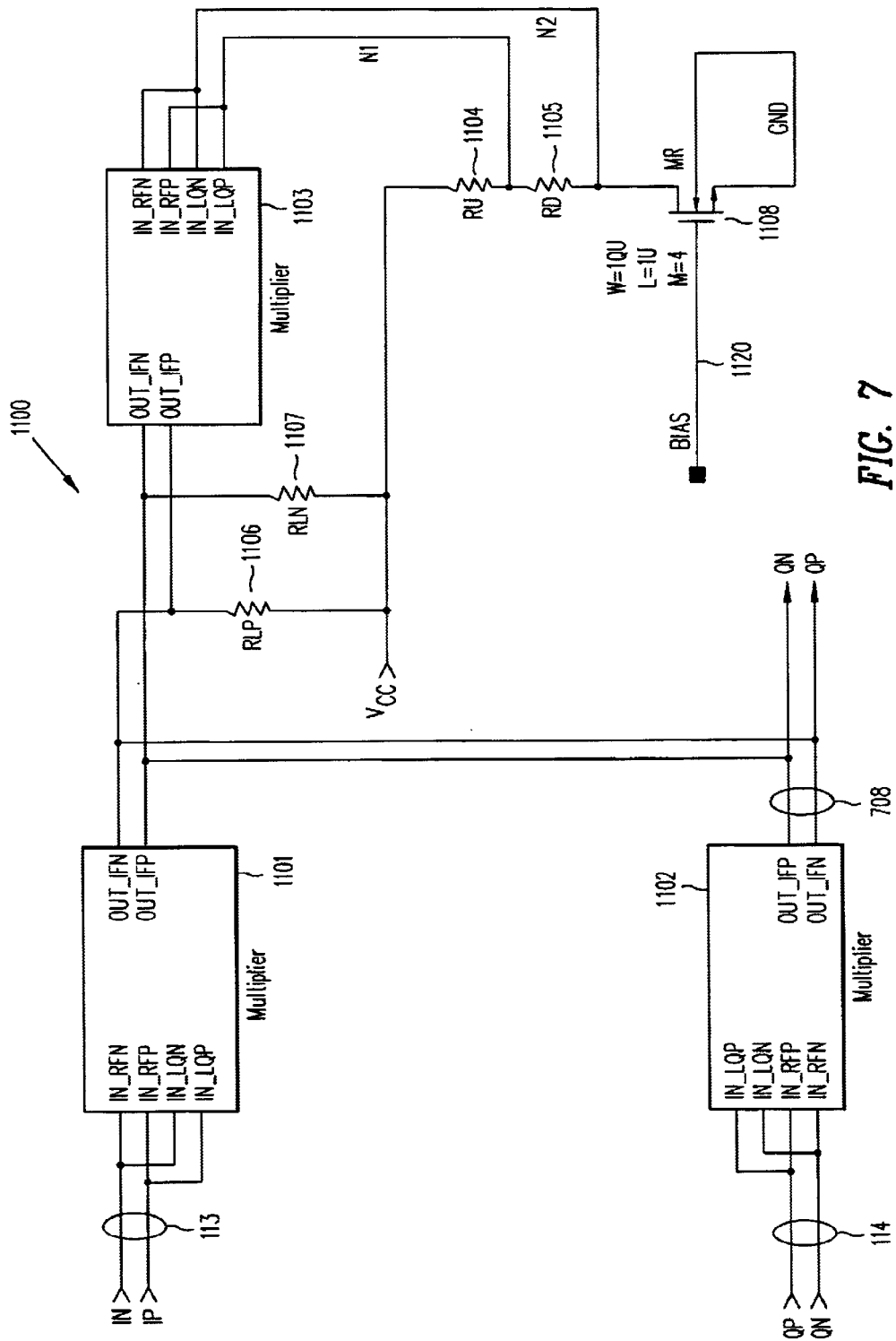
FIG. 7 shows enforcer circuit 1100, which can be used to implement enforcer 707 of FIG. 3, in accordance with one embodiment of the present invention.

FIG. 7 shows enforcer circuit 1100, which can be used to implement enforcer 707 of FIG. 4, in accordance with one embodiment of the present invention. As shown in FIG. 7, enforcer circuit 1100 includes differential multipliers 1101–1003, and resistors 1104–1107 and NMOS transistor 1108. Differential multipliers 1101–1103 can each be implemented, for example, by differential multiplier circuit 900 of FIG. 5. Multipliers 1101 and 1102 are configured to compute the squares of signals 113 and 114 (i.e., $I^2(t)$ and $Q^2(t)$), respectively. Transistor 1108 is biased by input bias signal at terminal 1120. In conjunction with resistors 1104–1105, transistor 1108 provides a current that is approximately 200 uA, thus providing a 0.4 volts differential input signal to multiplier 1103. 0.4 volts correspond to approximately twice the peak amplitude of the AC components of input signals 113 and 114. The output terminals of multipliers 1101–1103 are configured to provide output differential signal 708, which is the output differential signal of multiplier 1103, less the sum of the output differential signals of multipliers 1101–1102. (The polarity of the output differential signal of multiplier 1101 and 1102 are reversed.) Thus, output differential signal 708 (i.e., signal Δ) represents the value $\Delta = r^2 - I^2Q^2$.

Figure 8:
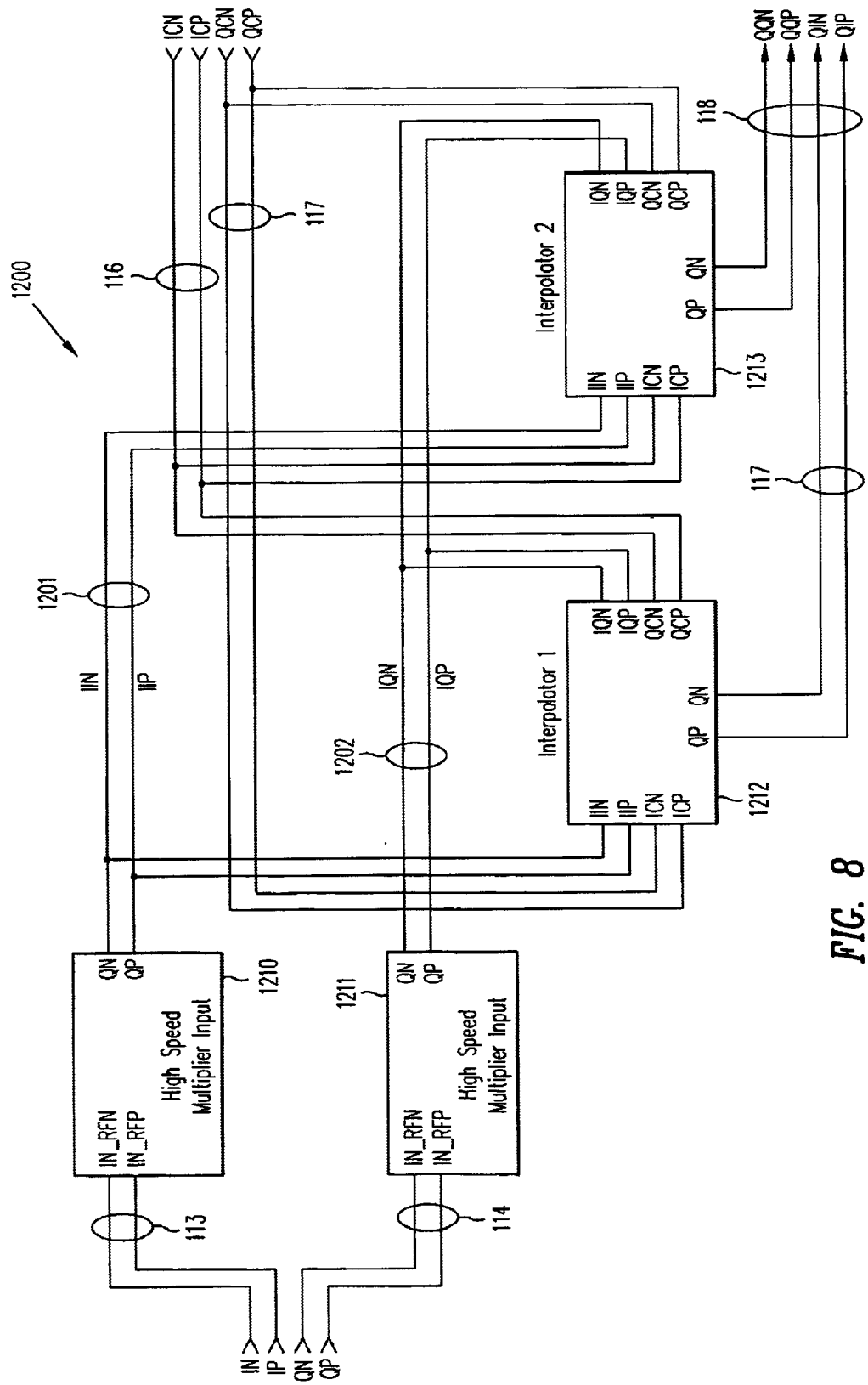
FIG. 8 shows interpolator circuit 1200, which can be used to implement interpolator 210 of FIG. 2, in accordance with one embodiment of the present invention.

Returning to FIG. 2, differential signals 113 and 114 and differential clock signals 116 and 117 are provided to interpolator 210 to provide differential output signals 115 and 118. FIG. 8 shows interpolator circuit 1200, which can be used to implement interpolator 210 of FIG. 2, in accordance with one embodiment of the present invention. As shown in FIG. 8, interpolator circuit 1200 includes amplifier circuits 1210 and 1211, and interpolator circuits 1212 and 1213. As configured in interpolator circuit 1200, interpolator circuits 1212 and 1213 each combine linearly phase signals 1201 (i.e., amplified phase signal 113 or I(t)) and 1202 (i.e., amplified phase signal 114 or Q(t)) with quadrature signals 116 (sin ω t) and 117 (cos ω t) to provide output differential signals 115 (C(t)) and 118 (S(t)), respectively.

Figure 9:
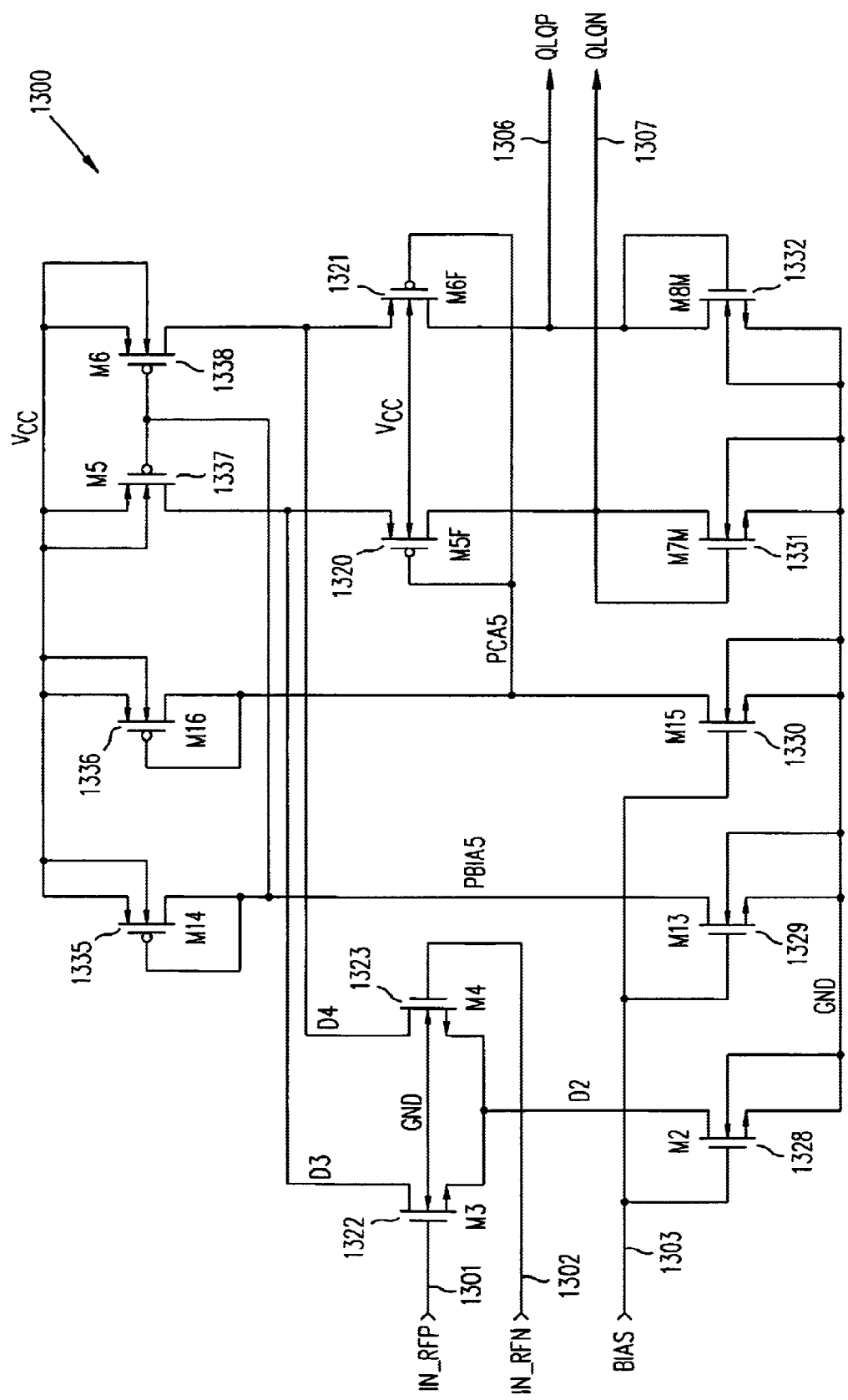
FIG. 9 shows differential amplifier circuit 1300, which can be used to implement either one of differential amplifiers 1210 and 1211 of FIG. 8.

FIG. 9 shows differential amplifier circuit 1300, which can be used to implement either one of differential amplifiers 1210 and 1211. As shown in FIG. 9, differential amplifier 1300 provides an output differential signal on terminals 1306 and 1307. In differential amplifier 1300, a bias voltage is provided at terminal 1303 to set the current sources represented by NMOS transistors 1328–1330. Diode-connected PMOS transistors 1336 and NMOS transistor 1330 together provide a first bias voltage, which is applied to the gate terminals of cascode PMOS transistors 1320 and 1321. Similarly, diode-connected PMOS transistor 1335 and NMOS transistor provides a second bias voltage, which is applied to PMOS transistors 1337 and 1338. Together, PMOS transistors 1320–1321 and 1337–1338 set a DC offset voltage for the output signals of differential amplifier circuit 1300 at terminals 1306 and 1307. The first input differential signal at terminals 1301 and 1302, i.e., the signals at the gate terminals of input transistors 1322 and 1323, respectively, are amplified to a proportional AC voltage superimposed on the DC offset voltage at output terminals 1306 and 1307.

Figure 10:
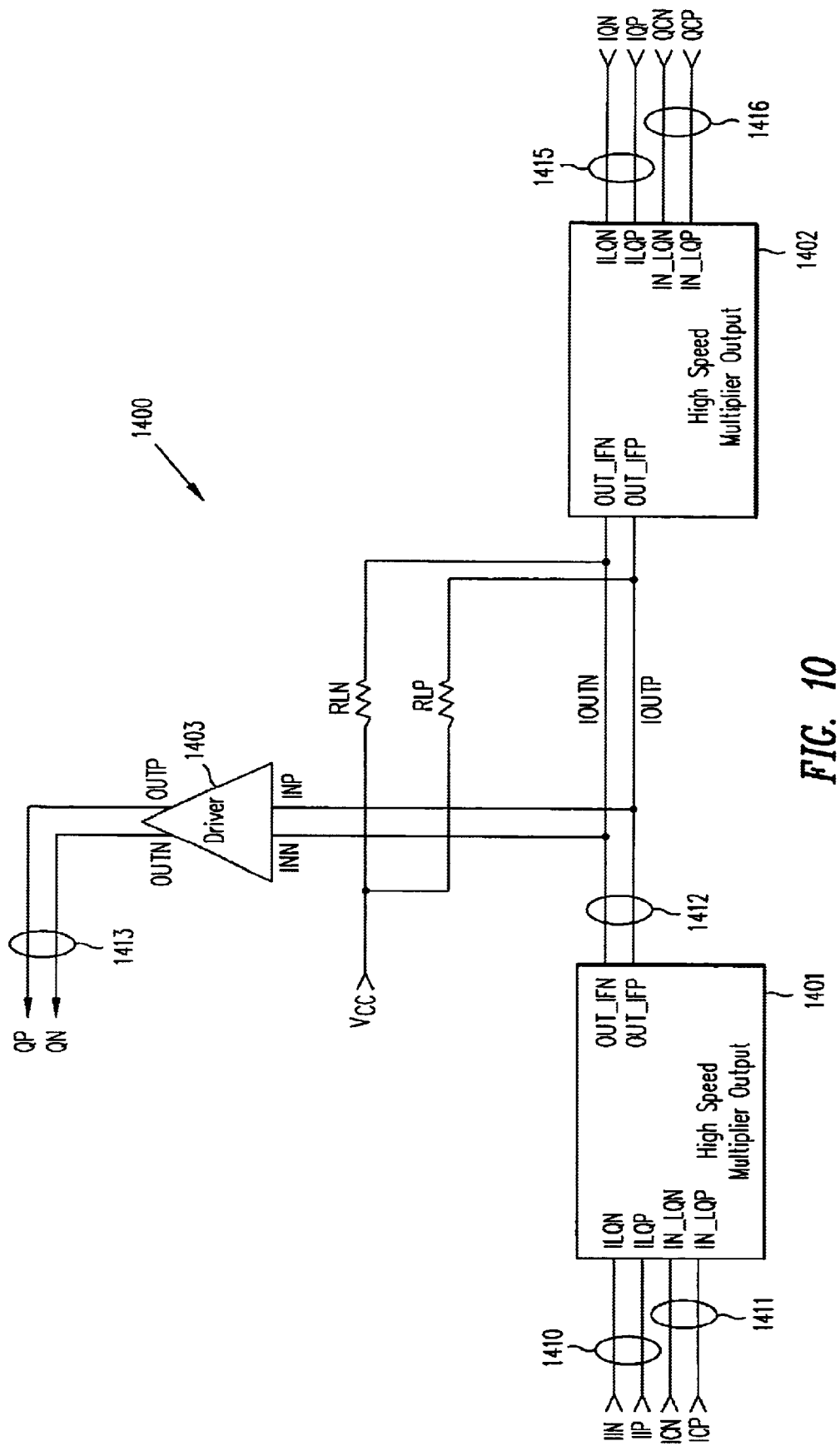
FIG. 10 shows interpolator circuit 1400, which can be used to implement either one of interpolator circuits 1212 and 1213.

FIG. 10 shows interpolator circuit 1400, which can be used to implement either one of interpolator circuits 1212 and 1213. As shown in FIG. 10, interpolator circuit 1400 includes multiplier circuits 1401 and 1402, each multiplier circuit being provided to multiply an amplified phase signal (i.e., signal 1410 or 1415) with a quadrature signal (i.e., signal 1411 or 1416). The differential output signals of multiplier circuits 1401 and 1402 are summed at terminals 1412, which is suitably amplified by amplifier 1403 to provide output differential signal 1413.

Figure 11:
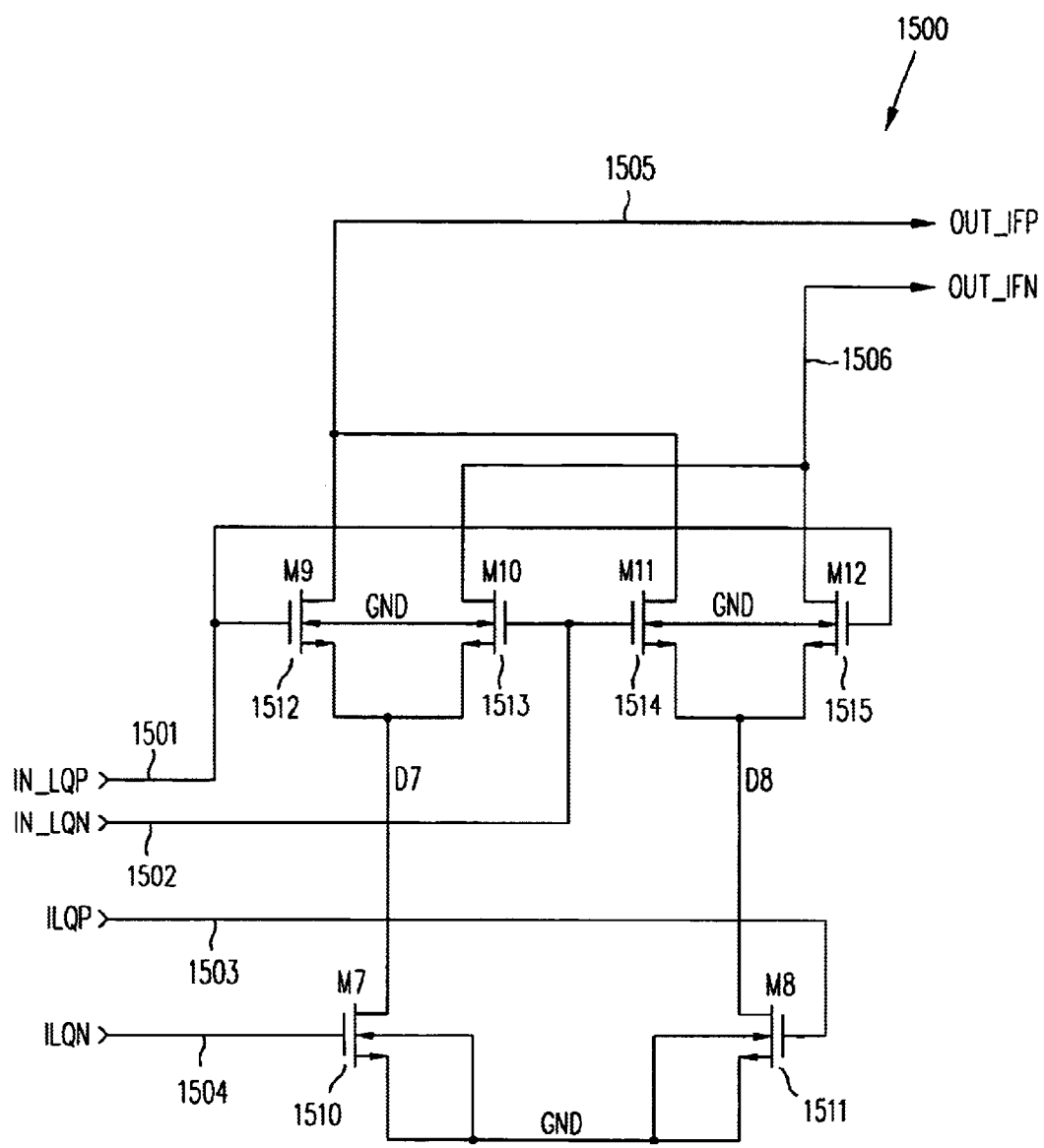
FIG. 11 shows multiplier circuit 1500, which can be used to implement either of multiplier circuits 1401 and 1402 of FIG. 10.

FIG. 11 shows multiplier circuit 1500, which can be used to implement either of multiplier circuits 1401 and 1402 of FIG. 10. As shown in FIG. 11, in multiplier circuit 1500, the signals of input terminals 1503 and 1504 set the current sources represented by NMOS transistors 1510 and 1511. Since the second input signal at input terminals 1501 and 1502 are provided to the gate terminals of input transistors 1512–1515 of multiplier 1500, the differential signal at terminals 1505 and 1506 represents the product of the first and second input differential signals.

The above detailed description is provided to illustrate specific embodiments of the present invention. Numerous modifications and variations within the scope of the present invention are possible. The present invention is set forth in the following claims.

We claim:

1. A phase-locked loop, comprising:
    a phase detector receiving an input signal and a first internal periodic signal and providing a phase signal indicative of a phase difference between said input signal and said first internal periodic signal;
    a rotator receiving said phase signal and providing a first periodic signal and a second periodic signal each having a period being a function of said phase difference, said first and said second periodic signals being 90 degrees out of phase relative to each other said rotator further comprising an enforcer which adjusts the amplitudes of the first periodic signal and the second periodic signal to within predetermined limits; and
    an interpolator circuit linearly combining said first and second periodic signals with a third periodic signal and a fourth periodic signal to provide said first internal periodic signal.

2. A phase-locked loop as in claim 1, wherein said interpolator circuit further providing a second internal periodic signal, said second internal periodic signal being 90 degrees out of phase relative to said first internal periodic signal.

3. A phase-locked loop as in claim 1, further comprising a low-pass filter provided between said phase detector and said rotator.

4. A phase-locked loop as in claim 2 wherein said rotator comprises an integrator.

5. A phase-locked loop as in claim 1, wherein said first (Q) and second (I) periodic signals are given by the equations:

$$Q = A \cos(kf(p))$$

$$I = A \sin(kf(p))$$

where A is an amplitude of each of signals Q and I, k is a gain of said rotator circuit, and f(p) represents a function of said phase difference.

6. A phase-locked loop as in claim 5, wherein said phase difference is represented in said phase signal as a voltage.

7. A phase-locked loop as in claim 5, wherein said function comprises integration.

8. A phase-locked loop as in claim 1, wherein said third and fourth periodic signals each have a frequency being substantially a frequency of said input signal.

9. A phase-locked loop as in claim 5, wherein said enforcer provides an error signal indicating a deviation in said first and second periodic signals from said equations.

10. A phase-locked loop as in claim 9, wherein said error signal is a function of the value $\Delta = r^2 - I^2 - Q^2$, where r is an amplitude of each of signals I and Q.

11. A phase-locked loop as in claim 5 wherein said third (x) and fourth (y) periodic signals are given by the equations:

$$x = \sin \omega t,$$

$$y = \cos \omega t,$$

where $\omega$ represents a frequency of said third and fourth periodic signals.

12. A phase-locked loop as in claim 11, wherein said first internal periodic signal S(t) is given by:

$$S(t) = \sin(\omega t - \phi),$$

where $\phi$ is indicative of said phase difference.

13. A method for providing a phase-locked loop, comprising:

receiving an input signal and a first internal periodic signal and providing a phase signal indicative of a phase difference between said input signal and said first internal periodic signal;

receiving said phase signal and providing a first periodic signal and a second periodic signal each having a period being a function of said phase difference, said first and said second periodic signals being 90 degrees out of phase relative to each other;

adjusting the amplitudes of the first periodic signal and the second periodic signal to within predetermined limits; and linearly combining said first and second periodic signals with a third periodic signal and a fourth periodic signal to provide said first internal periodic signal.

14. A method for providing a phase-locked loop as in claim 13, further providing a second internal periodic signal, said second internal periodic signal being 90 degrees out of phase relative to said first internal periodic signal.

15. A method for providing a phase-locked loop as in claim 13, further comprising providing a low-pass filter between said phase detector and said rotator.

16. A method for providing a phase-locked loop as in claim 14 wherein said rotator comprises an integrator.

17. A method for providing a phase-locked loop as in claim 13, wherein said first (Q) and second (I) periodic signals are given by the equations:

$$Q = A \cos(kf(p))$$

$$I = A \sin(kf(p))$$

where A is an amplitude of each of signals Q and I, k is a gain of said rotator circuit, and f(p) represents a function of said phase difference.

18. A method for providing a phase-locked loop as in claim 17, wherein said phase difference is represented in said phase signal as a voltage.

19. A method for providing a phase-locked loop as in claim 17, wherein said function comprises integration.

20. A method for providing a phase-locked loop as in claim 13, wherein said third and fourth periodic signals each have a frequency being substantially a frequency of said input signal.

21. A method for providing a phase-locked loop as in claim 17, wherein said adjusting comprises providing an error signal indicating a deviation in said first and second periodic signals from said equations.

22. A method for providing a phase-locked loop as in claim 17, wherein said error signal is a function of the value $\Delta = r^2 - I^2 - Q^2$, where r is an amplitude of each of signals I and Q.

23. A method for providing a phase-locked loop as in claim 17, wherein said third (x) and fourth (y) periodic signals are given by the equations:

$$x = \sin \omega t,$$

$$y = \cos \omega t,$$

where $\omega$ represents a frequency of said third and fourth periodic signals.

24. A method for providing a phase-locked loop as in claim 23, wherein said first internal periodic signal S(t) is given by:

$$S(t) = \sin(\omega t - \phi),$$

where $\phi$ is indicative of said phase difference.

* * * * *